United States Patent
Pehlke et al.

(10) Patent No.: US 6,960,956 B2
(45) Date of Patent: Nov. 1, 2005

(54) APPARATUS AND METHODS FOR MONITORING AND CONTROLLING POWER AMPLIFIER LINEARITY USING DETECTED FUNDAMENTAL AND HARMONIC COMPONENTS

(75) Inventors: David R. Pehlke, Chapel Hill, NC (US); Ronald Meadows, Youngsville, NC (US)

(73) Assignee: Telefonatiebolaget L.M. Ericsson Telefonplan, Stockholm (SE)

( * ) Notice: Subject to any disclaimer, the term of this patent is extended or adjusted under 35 U.S.C. 154(b) by 715 days.

(21) Appl. No.: 09/759,739

(22) Filed: Jan. 12, 2001

(65) Prior Publication Data

US 2002/0094791 A1  Jul. 18, 2002

(51) Int. Cl.$^7$ .......................... H04B 17/00; H04B 1/04; H03C 1/62
(52) U.S. Cl. ................. 330/127; 455/115.1; 455/127.1
(58) Field of Search ......................... 455/67.11, 67.13, 455/114.1, 114.2, 114.3, 115.1, 115.2, 115.3, 455/115.4, 198, 127.1, 127.2, 127.3, 127.5, 455/129.8, 522, 117; 330/86, 129, 132, 134, 330/279, 290, 149, 398, 2, 207 P, 298, 75, 330/127

(56) References Cited

U.S. PATENT DOCUMENTS

| | | | |
|---|---|---|---|
| 3,641,451 A * | 2/1972 | Hollingsworth et al. | 330/134 |
| 3,852,669 A * | 12/1974 | Bowman et al. | 455/117 |
| 4,011,512 A * | 3/1977 | Drury | 455/117 |
| 4,019,150 A | 4/1977 | Lurey et al. | 330/2 |
| 4,392,245 A | 7/1983 | Mitama | 455/115 |
| 4,882,547 A * | 11/1989 | Katz | 330/149 |
| 4,885,551 A * | 12/1989 | Myer | 330/52 |
| 5,036,527 A * | 7/1991 | Halim et al. | 375/345 |
| 5,038,112 A * | 8/1991 | O'Neill | 330/207 P |
| 5,164,678 A | 11/1992 | Puri et al. | 330/149 |
| 5,196,808 A * | 3/1993 | Pickett et al. | 330/298 |
| 5,278,994 A * | 1/1994 | Black et al. | 455/126 |
| 5,283,533 A * | 2/1994 | Hori | 330/2 |
| 5,423,081 A * | 6/1995 | Thiele et al. | 455/116 |
| 5,524,285 A | 6/1996 | Wray et al. | 455/126 |
| 5,530,923 A | 6/1996 | Heinonen et al. | 455/126 |
| 5,532,646 A | 7/1996 | Aihara | 330/279 |
| 5,606,285 A | 2/1997 | Wang et al. | 330/134 |
| 5,722,056 A | 2/1998 | Horowitz et al. | 435/126 |

(Continued)

OTHER PUBLICATIONS

Moulthrop et al., "A Dynamic AM/AM and AM/PM Measurement Technique," The Aerospace Corporation, 2350 East El Segundo Blvd., Los Angeles, CA 90245-4691.

(Continued)

*Primary Examiner*—Simon Nguyen
(74) *Attorney, Agent, or Firm*—Myers Bigel Sibley & Sajovec (57) ABSTRACT

An apparatus for monitoring a power amplifier coupled to a transmission medium includes a detector circuit, coupled to the transmission medium, that generates first and second detector signals corresponding to respective fundamental and harmonic components of a power amplifier output signal produced by the power amplifier. A comparing circuit is coupled to the detector circuit and compares the first and second detector signals. The comparing circuit, responsive to a comparison of the first and second detector signals, may generate a signal that indicates linearity of the power amplifier. In some embodiments, the detector circuit may generate the second detector signal without requiring phase information for the harmonic component. In other embodiments, a control circuit controls linearity of the power amplifier responsive to comparison of the first and second detector signals, for example, by controlling power amplifier bias and/or input signal level based on the comparison. Related methods are also discussed.

18 Claims, 10 Drawing Sheets

U.S. PATENT DOCUMENTS

| | | | |
|---|---|---|---|
| 5,973,568 A | 10/1999 | Shapiro et al. | 330/295 |
| 6,038,428 A | 3/2000 | Mizusawa et al. | 455/69 |
| 6,337,599 B2 * | 1/2002 | Lee | 330/149 |
| 6,625,429 B1 * | 9/2003 | Yamashita | 455/126 |

OTHER PUBLICATIONS

International Search Report, PCT/US01/50953, Jun. 16, 2003.

* cited by examiner

APPARATUS AND METHODS FOR MONITORING AND CONTROLLING POWER AMPLIFIER LINEARITY USING DETECTED FUNDAMENTAL AND HARMONIC COMPONENTS

BACKGROUND OF THE INVENTION

The present invention relates to communications apparatus and methods, and more particularly, to power amplifier monitoring and control apparatus and methods.

Communications apparatus often include a power amplifier that is used to amplify a signal to appropriate levels for transmission, for example, in free space or on a transmission line. For example, wireless terminals (e.g., cellular telephones and other wireless-capable devices) typically include a power amplifier that is used to amplify a radio frequency (RF) signal for transmission by an antenna.

Power amplifiers often encounter non-ideal reflection arising from impedance mismatches between the power amplifier and transmission medium. In the case of a wireless terminal power amplifier, for example, impedance mismatches may be caused by a variety of factors, including changes in surroundings caused by motion of the terminal and/or objects in the terminal's environment. Such changes may occur, for example, when the terminal is moved near a user's body or near reflective or shielding structures.

Impedance mismatches can significantly affect performance of a power amplifier. For example, impedance mismatch may cause the voltage standing wave ratio (VSWR) presented to the power amplifier to be high enough to cause damaging voltages and/or currents at the power amplifier's output. In addition, large reflected power and high VSWR may lead to performance-degrading phenomena, such as AM/AM and AM/PM distortion.

Conventional solutions for avoiding or reducing such problems include reducing mismatch and/or reducing its damaging or degrading effects. In a wireless terminal, for example, mismatch can be reduced by using an isolator or a balanced antenna circuit. Other conventional approaches attempt to detect when undesirable or dangerous VSWR or reflected power conditions are present (or are about to be present), and take corrective and/or protective actions that can prevent damage or reduce performance degradation.

SUMMARY OF THE INVENTION

In embodiments of the invention, an apparatus for monitoring a power amplifier coupled to a transmission medium includes a detector circuit, coupled to the transmission medium, that generates first and second detector signals corresponding to respective fundamental and harmonic components of a power amplifier output signal produced by the power amplifier. A comparing circuit is coupled to the detector circuit and compares the first and second detector signals. The comparing circuit, responsive to a comparison of the first and second detector signals, may generate a signal that indicates linearity of the power amplifier.

In some embodiments of the invention, the detector circuit may generate the second detector signal without requiring phase information for the harmonic component. For example, the detector circuit may include a directional coupler and a first power detector that generate the first detector signal. The second detector signal may be generated by a combination of a filter, in particular, a bandpass or high pass filter coupled to the transmission medium by a high impedance shunt circuit, and a second power detector. Such a configuration may take advantage of a low pass filter coupled to the power amplifier's output, which reflects the harmonic component such that detection of the harmonic based on amplitude is substantially independent of impedance matching between the power amplifier and a load, such as an antenna.

In other embodiments of the invention, the detector circuit includes a first directional coupler that couples a power amplifier to the antenna and that generates a first output signal responsive to the power amplifier output signal. A first power detector is coupled to the first directional coupler and generates a first detector signal corresponding to a fundamental component of a power amplifier output signal from the first output signal. The detector circuit further includes a second directional coupler that couples the power amplifier to the antenna and that generates a second output signal. A second power detector, coupled to the second directional coupler, generates a second detector signal corresponding to a harmonic component of the power amplifier output signal from the second output signal. The first output signal may correspond to a forward fundamental component, and the second output signal may correspond to a reflected harmonic component. The second directional coupler may be a dual-band coupler that may also detect a reflected fundamental component.

According to other embodiments of the invention, an apparatus includes an antenna and a power amplifier that generates a power amplifier output signal in a transmission medium coupling the power amplifier to the antenna. A detector circuit, coupled to the transmission medium, generates first and second detector signals corresponding to respective fundamental and harmonic components of the power amplifier output signal. A control circuit, coupled to the detector circuit and operatively associated with the power amplifier, controls the power amplifier responsive to a comparison of the first and second detector signals. In particular, the control circuit may control linearity of the power amplifier responsive to a comparison of the first and second detector signals, for example, by controlling the level of an input signal applied to the power amplifier and/or DC bias of the power amplifier. The detector circuit may include various combinations of directional couplers and filter circuits as described above.

According to method embodiments of the invention, first and second detector signals corresponding to respective fundamental and harmonic components of a power amplifier output signal are generated. The first and second detector signals are compared to determine linearity of the power amplifier. The power amplifier linearity may be controlled responsive to the comparison of the first and second detector signals, for example, by controlling input signal level and/or DC bias.

DETAILED DESCRIPTION OF THE INVENTION

The present invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As will be appreciated by those of skill in the art, the present invention may be embodied as methods or apparatus.

For power amplifier applications in which an input signal having a desired, fundamental frequency is applied to a power amplifier, non-linear operation (e.g., saturation or clipping) of the amplifier can be detected by comparison of fundamental and harmonic components of the output signal produced by the amplifier. These fundamental and harmonic components can be detected in ways that take advantage of components, such as directional couplers and output filters, typically used in wireless or other transmitters for purposes other than power amplifier linearity detection, as will be described for various embodiments of the invention herein.

Figure 1:
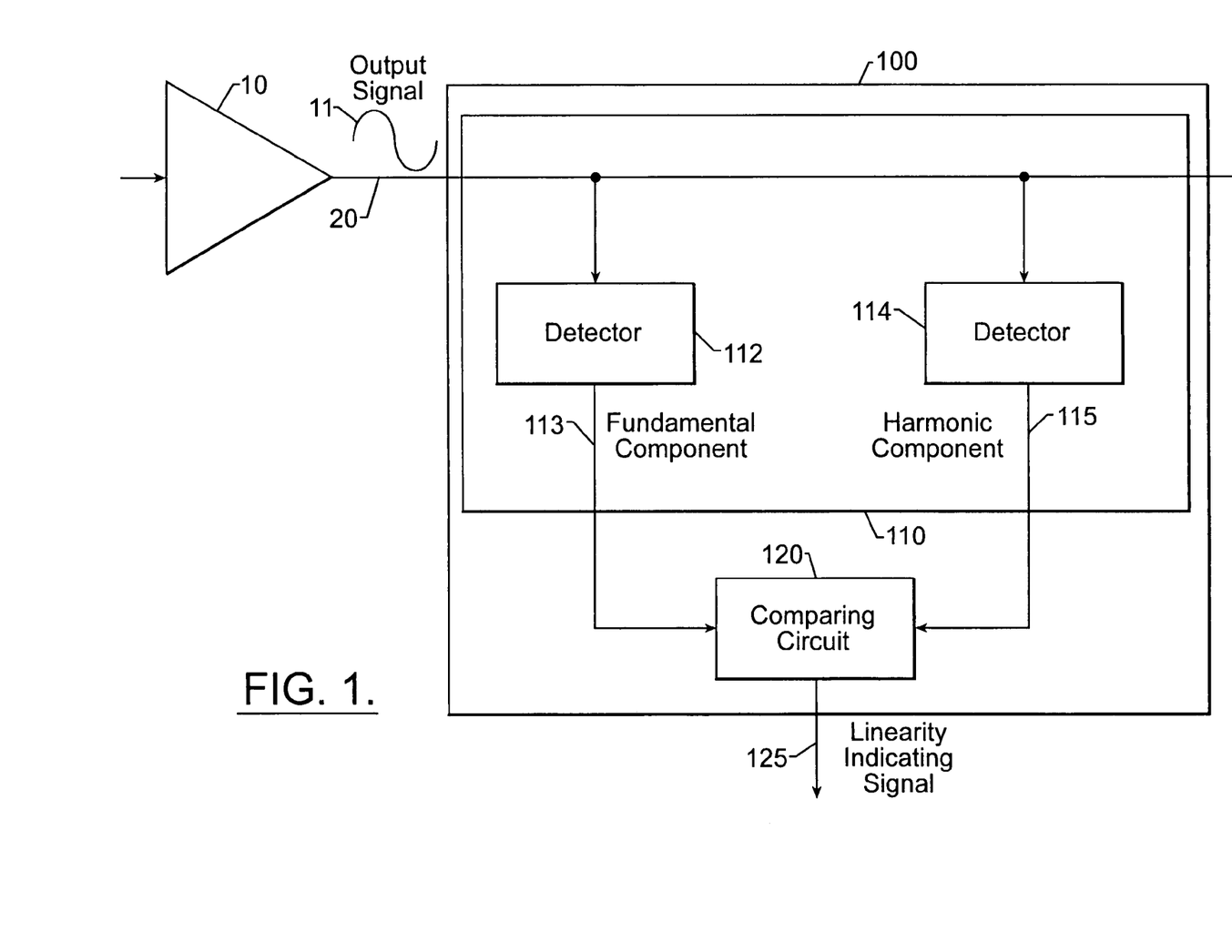
FIGS. 1–4 are schematic block diagrams illustrating power amplifier monitoring apparatus and operations according to embodiments of the invention.

FIG. 1 illustrates a power amplifier monitoring apparatus 100 according to embodiments of the invention. A power amplifier 10 generates an output signal 11 (e.g., a radio frequency (RF) signal) on a transmission line 20. The monitoring apparatus 100 includes a detector circuit 110, here shown as including first and second detectors 112, 114. The first detector 112 generates a first detector signal 113 corresponding to a fundamental component of the power amplifier output signal 11. The second detector 114 generates a second detector signal 115 that corresponds to a harmonic component of the power amplifier output signal 11. The monitoring apparatus 100 further includes a comparing circuit 120 that compares the first and second detector signals 113, 115, and generates a power amplifier linearity indicating signal 125 based on the comparison.

The linearity indicating signal 125 is generated based on a comparison of the first and second detector signals 113, 115. For example, the first and second detector signals 113, 115 may be analog signal power sense signals that are generated using diode-type power detection circuits, such as the detection circuit 930 discussed below with reference to FIG. 9. Such signals may be compared using, for example, an analog comparison circuit, such as the comparison circuit 1000 discussed below with reference to FIG. 10.

It will also be appreciated that, generally, the detector circuit 110 and the comparing circuit 120 of the monitoring apparatus 100 may be implemented in a number of different forms. For example, the detector circuit 100 may utilize analog and/or digital circuitry to implement the functions of the detectors 112, 114, such as frequency selective couplers and analog filters that detect selected components of the power amplifier output signal 11, and analog power detectors that determine respective power levels of the passed components. Some of these functions may alternatively be performed by analogous digital circuitry, such as by code executing on a data processor such as a microprocessor, microcontroller or digital signal processor (DSP).

Similarly, the comparing circuit 120 may be implemented in analog circuitry, digital circuitry, or combinations thereof. For example, if the detector signals 113, 115 produced by the detector circuit 110 include respective analog voltages representing respective power levels of respective fundamental and harmonic components of the power amplifier output signal 11, the comparing circuit 120 may include, for example, an analog comparator circuit or a similar circuit that compares the respective voltage levels and generates and output signal representative of the comparison. It will be appreciated, however, that other comparison techniques may also be used.

Figure 2:
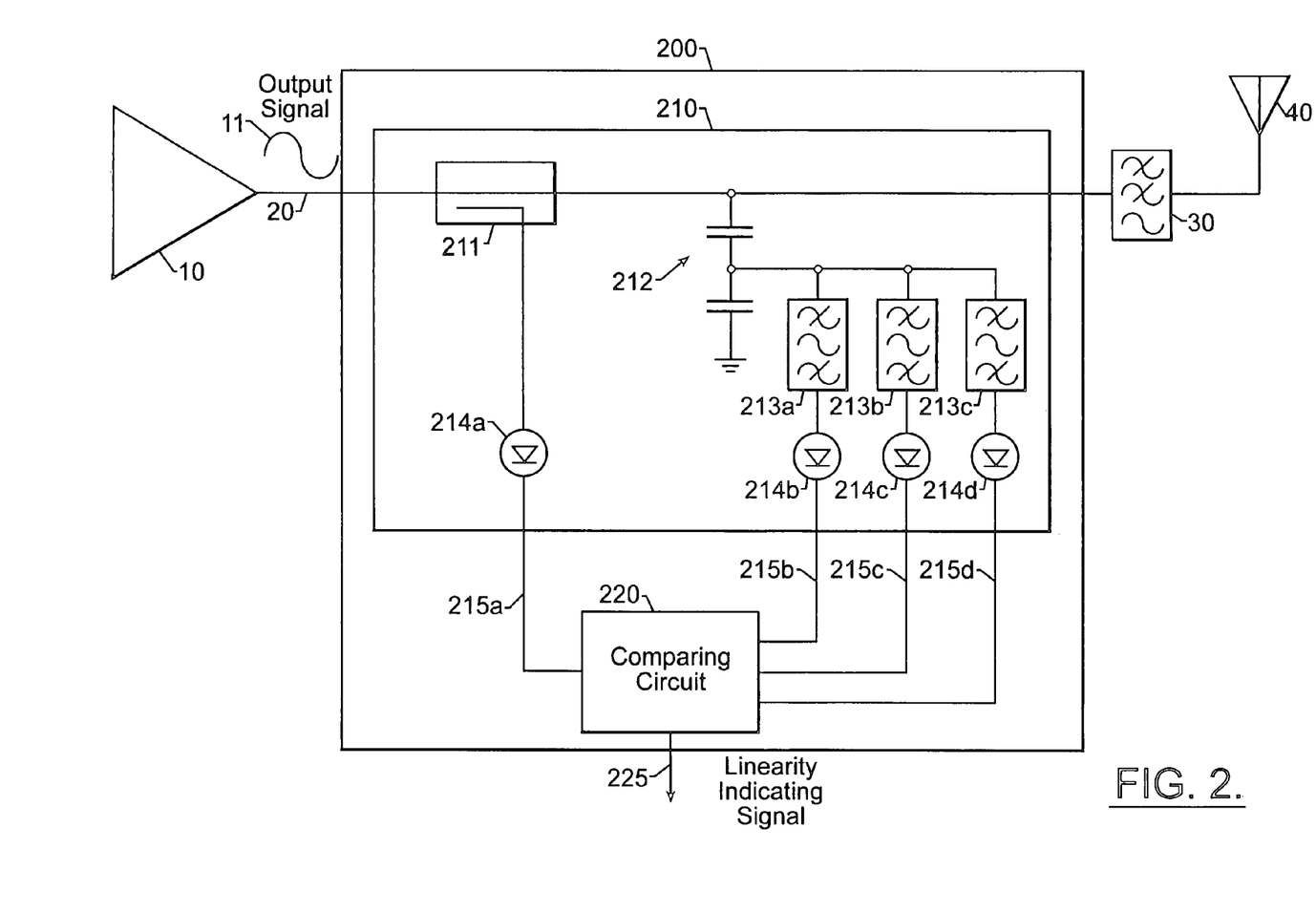

FIG. 2 illustrates an exemplary implementation of a power amplifier monitoring apparatus 200 according to embodiments of the invention. As in FIG. 1, a power amplifier 10 generates an output signal 11 on a transmission line 20, here shown as connected to a low pass filter 30 and an antenna 40. The power amplifier monitoring apparatus 200 includes a detector circuit 210 coupled to the transmission line 20. The detector circuit 210 includes a directional coupler 211 coupled to a first power detector 214a. In combination, the directional coupler 211 and the first power detector 214a generate a first detector signal 215a representing power of a forward fundamental component of the power amplifier output signal 11.

The detector circuit 210 further includes first, second, and third bandpass filters 213a, 213b, 213b, that are capacitively coupled to the transmission line 20 by a high-impedance capacitive shunt circuit 212. The bandpass filters 213a, 213b, 213c may be designed to respective harmonics of the fundamental frequency of the power amplifier output signal 11. In combination with respective second, third and fourth power detectors 214b, 214c, 214d, the respective bandpass filters 213a, 213b, 213c generate respective second, third, and fourth detector signals 215b, 215c, 215d representing respective power levels of respective harmonic components of the power amplifier output signal 11. The detector signal 215a for the forward fundamental component is compared with the detector signals 215b, 215c, 215d for the harmonic components in a comparing circuit 220, which generates a linearity indicating signal 225 based on the comparison.

It will be understood that the detector circuit 210 and comparing circuit 220 of the monitoring apparatus 200 may be implemented using a variety of different components. For example, the power detectors 214a, 214b, 214c may include discrete RF diode detector circuits and/or integrated circuit devices that provide similar functionality. As will be appreciated by those skilled in the art, such detector circuits may produce an analog and/or a digital output signal representative of the power detected by the detector circuit 210. Accordingly, the comparing circuit 220 may include analog and/or digital circuitry appropriate for processing such signals.

The monitoring apparatus 200 can take advantage of elements that are typically found in a wireless terminal or other device, but are conventionally used for other purposes. In particular, a directional coupler and associated power detector, such as the directional coupler 211 and the first power detector 214a, may be used in a wireless terminal to perform conventional power control functions, such as output power and VSWR control. Accordingly, generation of the first detector signal 215a may not require additional hardware.

The shunt circuit 212 and filters 213a, 213b, 213c can take advantage of the presence of the output filter 30 to simplify detection of harmonics. In particular, a potential problem in determining power levels for a harmonic is accounting for changes in relative amplitudes of forward and reflected harmonic waves arising from changes in impedance on the transmission line 20. The low pass filter 30, which is typically designed to preferentially pass the fundamental component of the power amplifier output signal 11, may reflect the harmonic such that detection of the harmonic power based on amplitude information is substantially independent of antenna matching. This allows the use of shunt elements, such as the shunt circuit 212 and filters 213a, 213b, 213c, which can provide potentially less loss than might be experienced if additional series elements are used.

Figure 3:
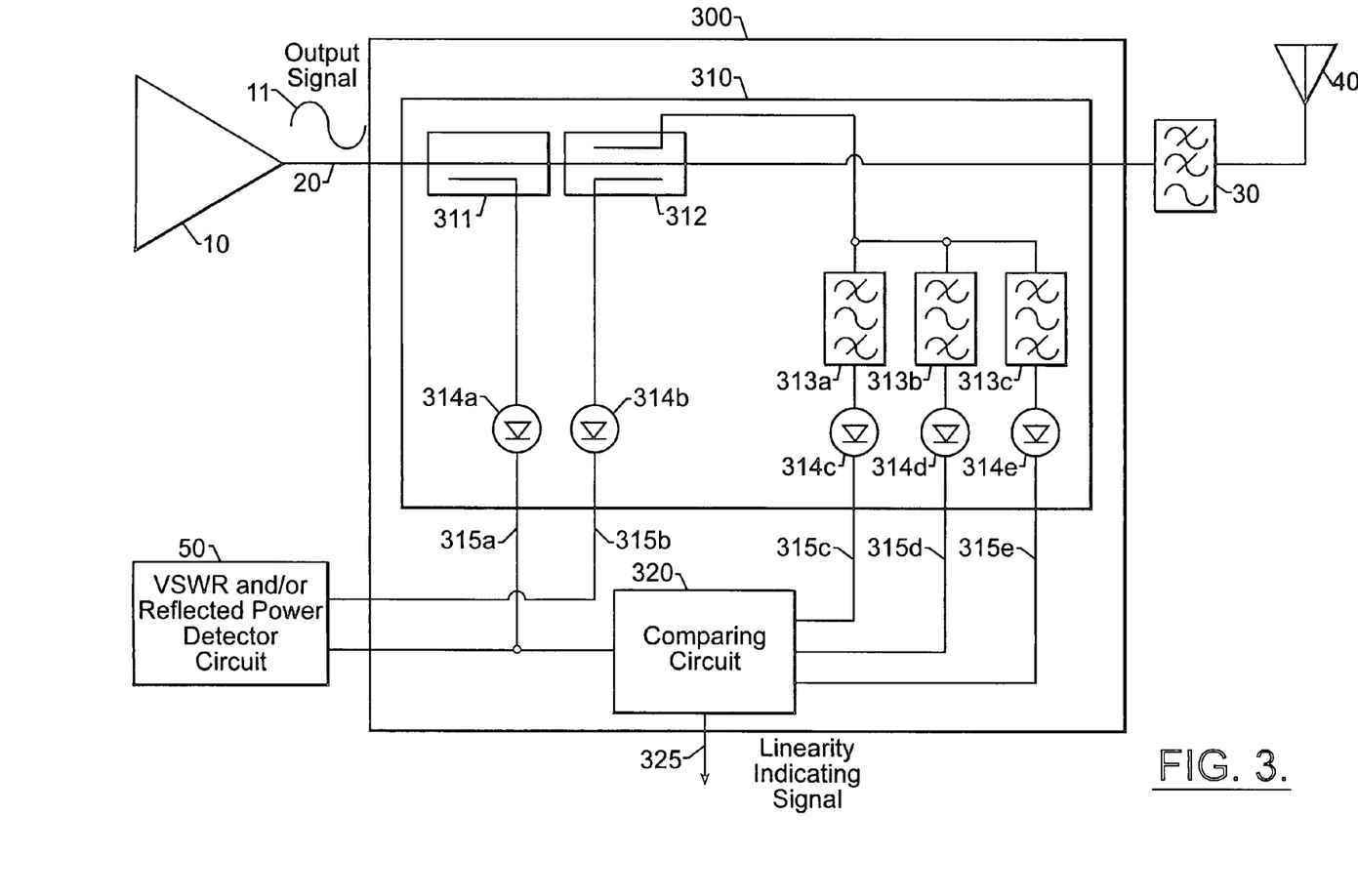

FIG. 3 illustrates an alternative configuration for a power amplifier monitoring apparatus 300 according to other embodiments of the invention. The power amplifier 10, transmission line 20, low pass filter 30 and antenna 40 are as described above with reference to FIG. 2. The monitoring apparatus 300 includes a detector circuit 310 coupled to the transmission line 20 and operatively associated with a comparing circuit 320. The detector circuit 310 includes a forward directional coupler 311 coupled to a first power detector 314a, which produces a first detector signal 315a representing power of a forward fundamental component of a power amplifier output signal 11. A second, dual-band directional coupler 312 has a first output coupled to a second power detector 314b, which generates a second detector signal 315b that represents power of a reflected fundamental component of the power amplifier output signal 11.

The second directional coupler 312 also has a second output coupled to a bank of bandpass filters 313a, 313b, 313c. Respective ones of the bandpass filters 313a, 313b, 313c pass respective selected harmonics of the fundamental of the power amplifier output signal 11. Respective ones of the band pass filters 313a, 313b, 313c are coupled to respective ones of third, fourth and fifth power detectors 314c, 314d, 314e, which generate respective third, fourth and fifth detector signals 315c, 315d, 315e representing respective power levels of the selected harmonics. The third, fourth and fifth detector signals 315c, 315d, 315e, representing the harmonic power levels, and the first detector signal 315a, representing the forward fundamental power, are compared by the comparing circuit 320 to generate a linearity indicating signal 325. As shown, the first and second detector signals 315a, 315b may also be passed on to a circuit 50 that detects VSWR and/or reflected power.

Figure 4:
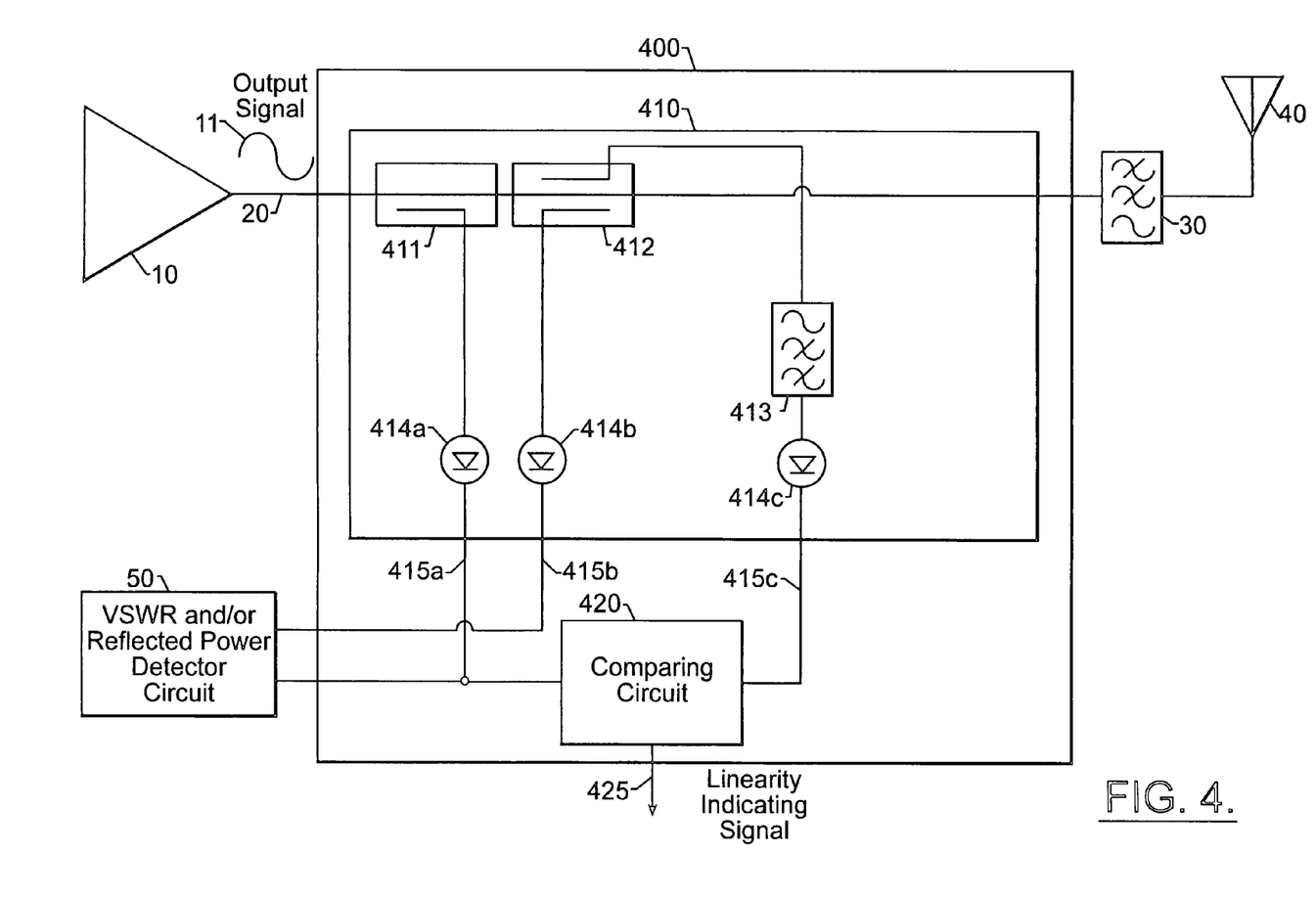

FIG. 4 illustrates yet another alternative configuration for a power amplifier monitoring apparatus 400 according to other embodiments of the invention. The power amplifier 10, transmission line 20, low pass filter 30 and antenna 40 are as described above with reference to FIG. 2. The monitoring apparatus 400 includes a detector circuit 410 coupled to the transmission line 20 and operatively associated with a comparing circuit 420. The detector circuit 410 includes a forward directional coupler 411 coupled to a first power detector 414a, which produces a first detector signal 415a representing power of a forward fundamental component of a power amplifier output signal 11. A second, dual-band directional coupler 412 has a first output coupled to a second power detector 414b, which generates a second detector signal 415b that represents power of a reflected fundamental component of the power amplifier output signal 11.

The second directional coupler 412 also has a second output coupled to a high pass filter 413. The high-pass filter 413 passes one or more selected harmonics of the fundamental. The high pass filter 413 is coupled to a broadband power detector 414c, which generates a third detector signal 415c representing an aggregate power level of the selected harmonic(s). The third detector signal 415c and the first detector signal 415a are compared by the comparing circuit 420 to generate a linearity indicating signal 425. As shown, the first and second detector signals 415a, 415b may also be passed on to a circuit 50 that detects VSWR and/or reflected power.

Figure 5:
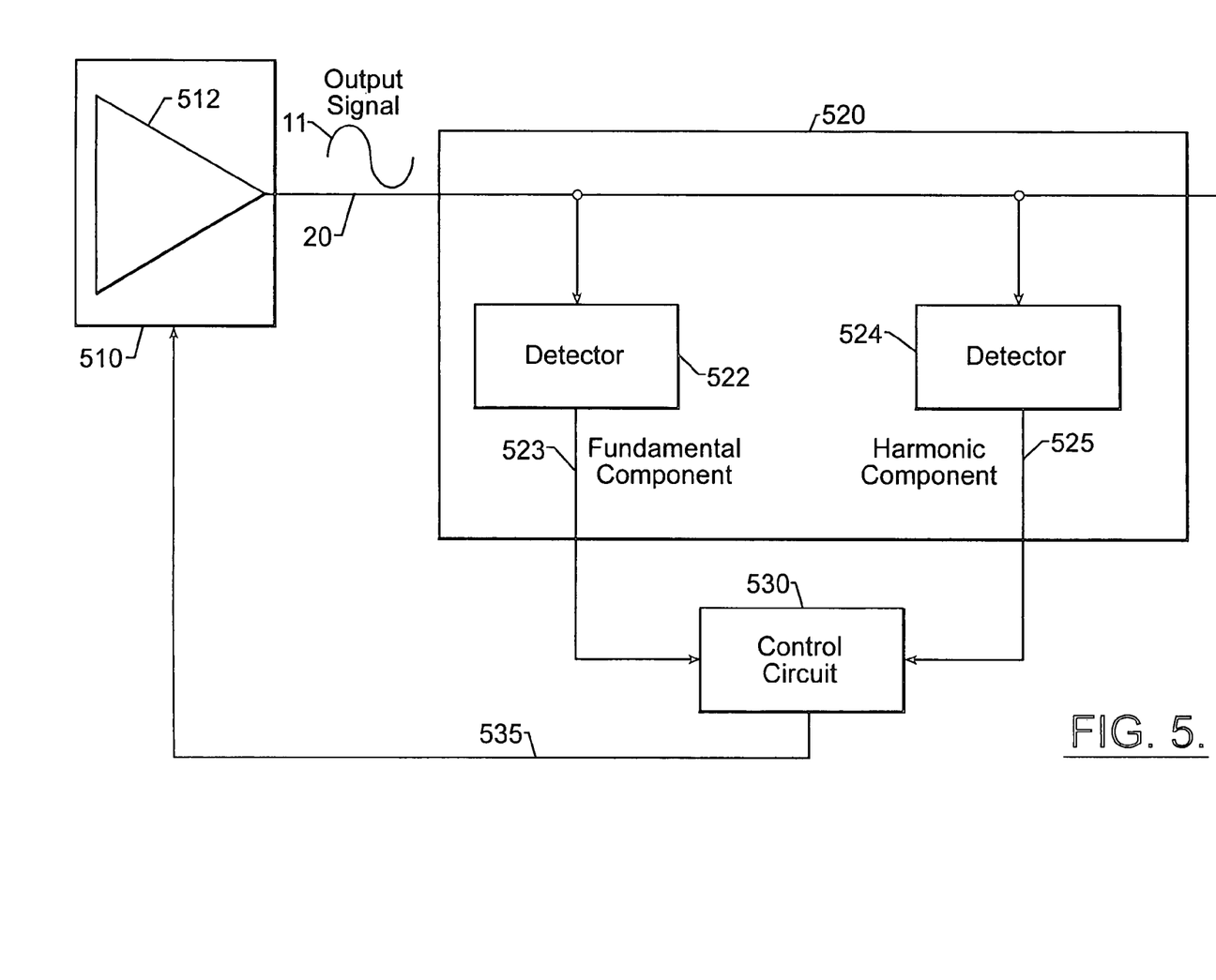
FIGS. 5–8 are schematic block diagrams illustrating power amplifier control apparatus and operations according to embodiments of the invention.

FIG. 5 illustrates other embodiments of the present invention. A signal processing circuit 510, including a power amplifier 512, generates an output signal 11 on a transmission line 20. The signal processing circuit 510 is responsive to a control input 535 to adjust the linearity of the power amplifier 512, for example, to change the DC bias if the power amplifier 512 and/or the input signal level presented to the power amplifier 512. A detector circuit 520 is coupled to the transmission line 20, and includes first and second detectors 522, 524 that generate respective first and second detector signals 523, 525 corresponding to respective fundamental and harmonic components of the power amplifier output signal 11. A control circuit 530 is responsive to the first and second detector signals 523, 525 and generates the control input 535 based on a comparison of the first and second detector signals 523, 525.

Figure 6:
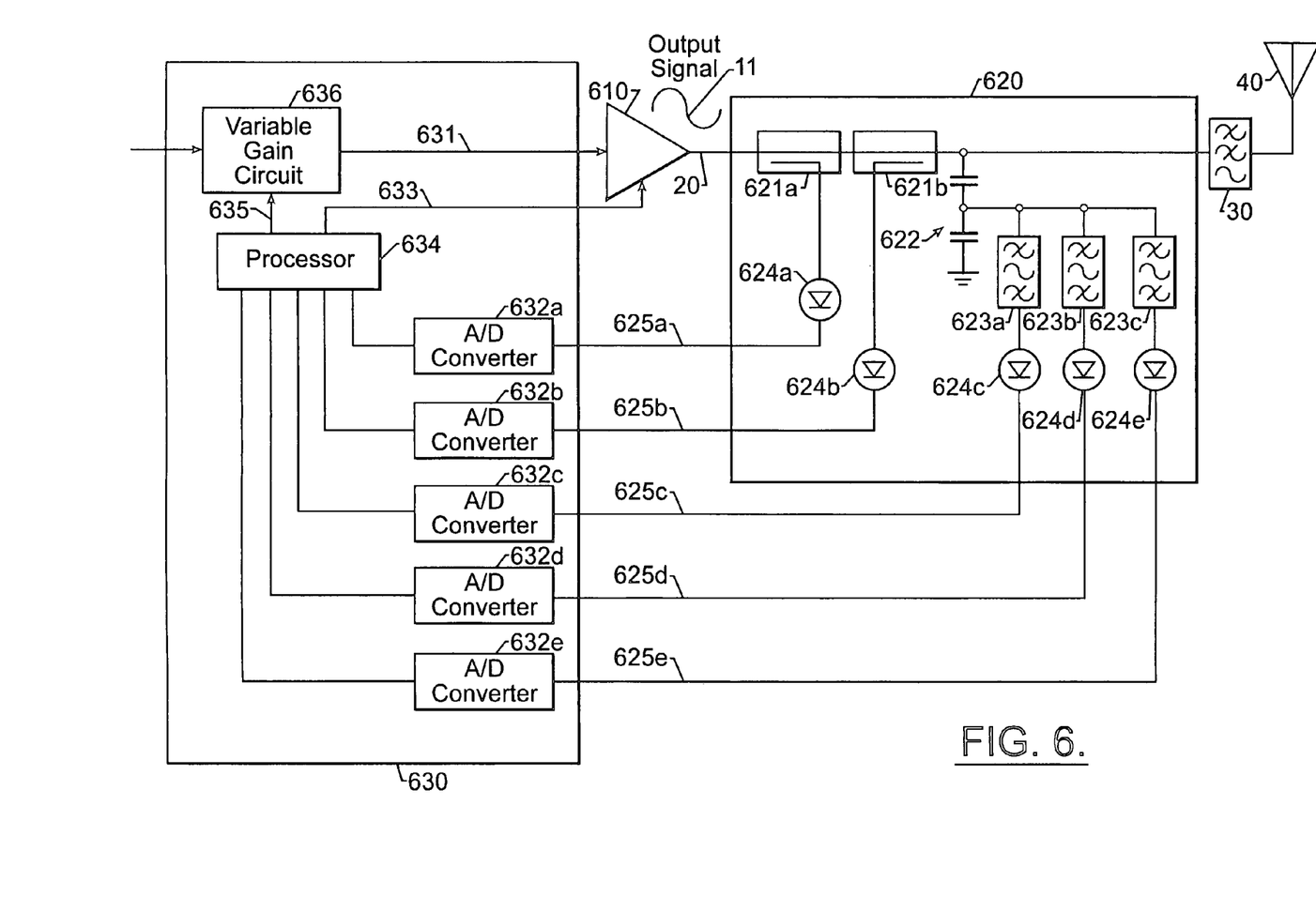

According to other embodiments of the invention illustrated in FIG. 6, a power amplifier 610 receives an input signal 631 from a variable gain circuit 636 of a control circuit 630 and, responsively thereto, generates an output signal 11 on a transmission line 20 coupled to a low pass filter 30 and antenna 40. The power amplifier 610 operates with a DC bias controlled by a bias control signal 633 applied by a processor 634 in the control circuit 630. A detector circuit 620 is coupled to the transmission line 20, and includes a first and second directional couplers 621a, 621b coupled to respective first and second power detectors 624a, 624b. The first and second power detectors 624a, 624b generate respective first and second detector signals 625a, 625b representing respective forward and reflected fundamental power levels of the power amplifier output signal 11.

The detector circuit 620 further includes first, second and third bandpass filters 623a, 623b, 623c coupled to the transmission line 20 by a shunt circuit 622. Responsive to the bandpass filters 623a, 623b, 623c, third, fourth, and fifth power detectors 624c, 624d, 624e generate third, fourth and fifth detector signals 625c, 625d, 625e that represent respective power levels of respective harmonic components of the power amplifier output signal 11.

The control circuit 630 further includes first, second, third, fourth, and fifth analog to digital (A/D) converters 632a, 632b, 632c, 632d, 632e that receive respective ones of the detector signals 625a, 625b, 625c, 625d, 6235e, and generate digital values therefrom representing respective measured power levels for the fundamental and harmonic components. These digital values are passed on to the processor 634, which generates a level control signal 635 for the variable gain circuit 636 and the bias control signal 633 based on a comparison of the digital values.

It will be appreciated that the detector circuit 620 and the control circuit 630 of FIG. 6 may be implemented in a number of different ways. For example, the processor 634 may include a microcontroller, microcomputer, digital signal processor or similar computing device, which may implement other computing or signal processing operations in addition to the comparing and control operations described above. The variable gain circuit 636 may, for example, be a variable gain amplifier or similar device in an RF signal path, or may be integrated into other signal processing apparatus, such as a modulator, that can vary the level of the input signal 631 applied to the power amplifier 610.

Figure 7:
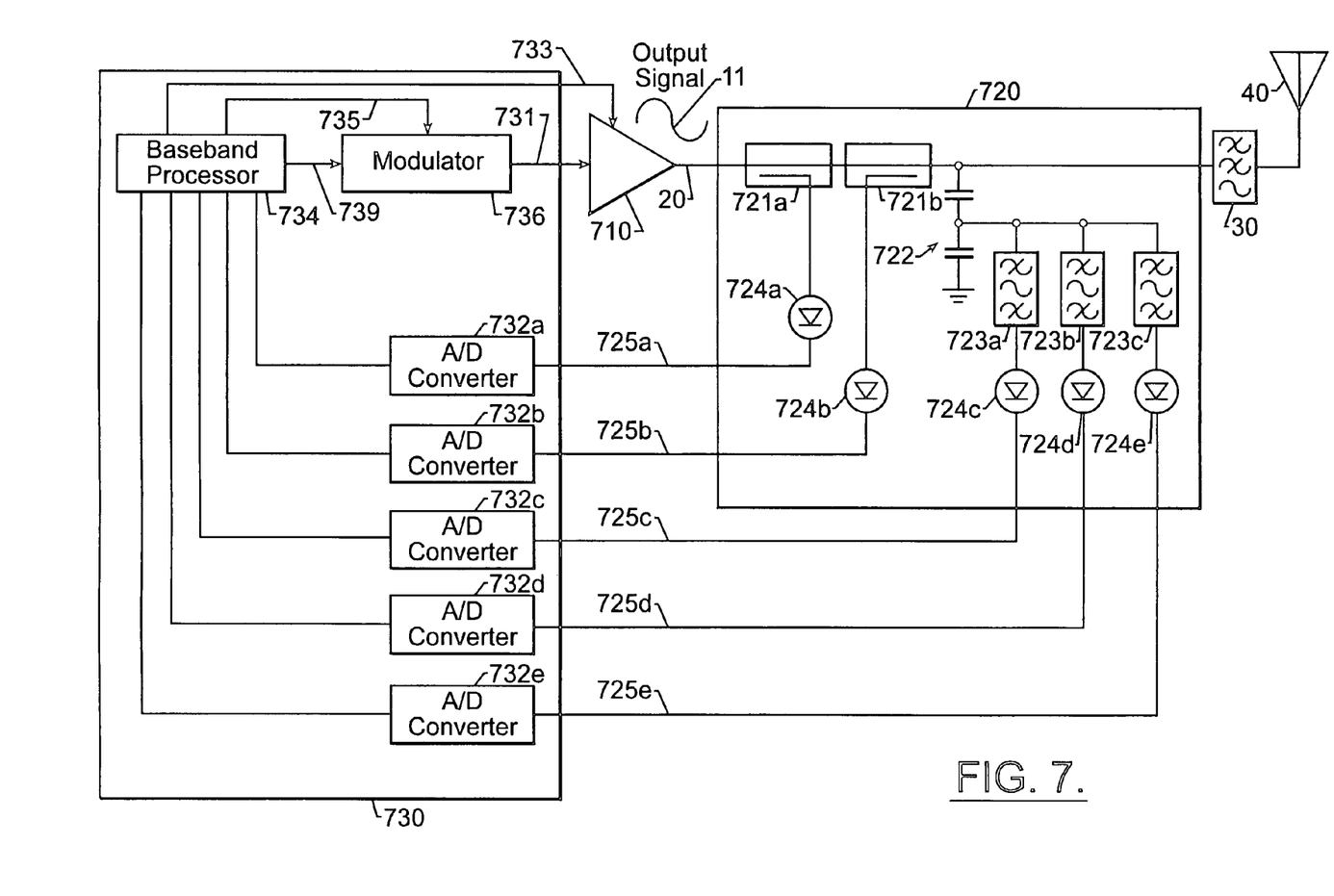

An implementation as might be used in a wireless terminal according to embodiments of the invention is illustrated in FIG. 7. A power amplifier 710 receives an input signal 731

(e.g., an RF carrier modulated signal) from a modulator 736 in a control circuit 730. The modulator 736 generates the input signal 731 responsive to a data signal 739 generated by a baseband processor 734 of the control circuit 730, with a level that is controlled responsive to a level control signal 735. Responsive to the input signal 731, the power amplifier 710 generates an output signal 11 on a transmission line 20 coupled to a low pass filter 30 and antenna 40. The power amplifier 710 operates with a DC bias controlled by a bias control signal 733 applied by the baseband processor 734.

A detector circuit 720 is coupled to the transmission line 20, and includes a first and second directional couplers 721a, 721b coupled to respective first and second power detectors 724a, 724b. The first and second power detectors 724a, 724b generate respective first and second detector signals 725a, 725b representing respective forward and reflected fundamental power levels of the power amplifier output signal 11. The detector circuit 720 further includes first, second and third bandpass filters 723a, 723b, 723c coupled to the transmission line 20 by a shunt circuit 722. Responsive to the bandpass filters 723a, 723b, 723c, third, fourth, and fifth power detectors 724c, 724d, 724e generate third, fourth and fifth detector signals 725c, 725d, 725e that represent respective power levels of respective harmonic components of the power amplifier output signal 11.

The control circuit 730 also includes first, second, third, fourth, and fifth analog to digital (A/D) converters 732a, 732b, 732c, 732d, 732e that receive respective ones of the detector signals 725a, 725b, 725c, 725d, 725e, and generate digital values therefrom representing respective measured power levels for the fundamental and harmonic components. These digital values are passed on to the baseband processor 734, which generates the level control signal 735 and the bias control signal 733 based on a comparison of the fundamental and harmonic power levels represented by the digital values.

Figure 8:
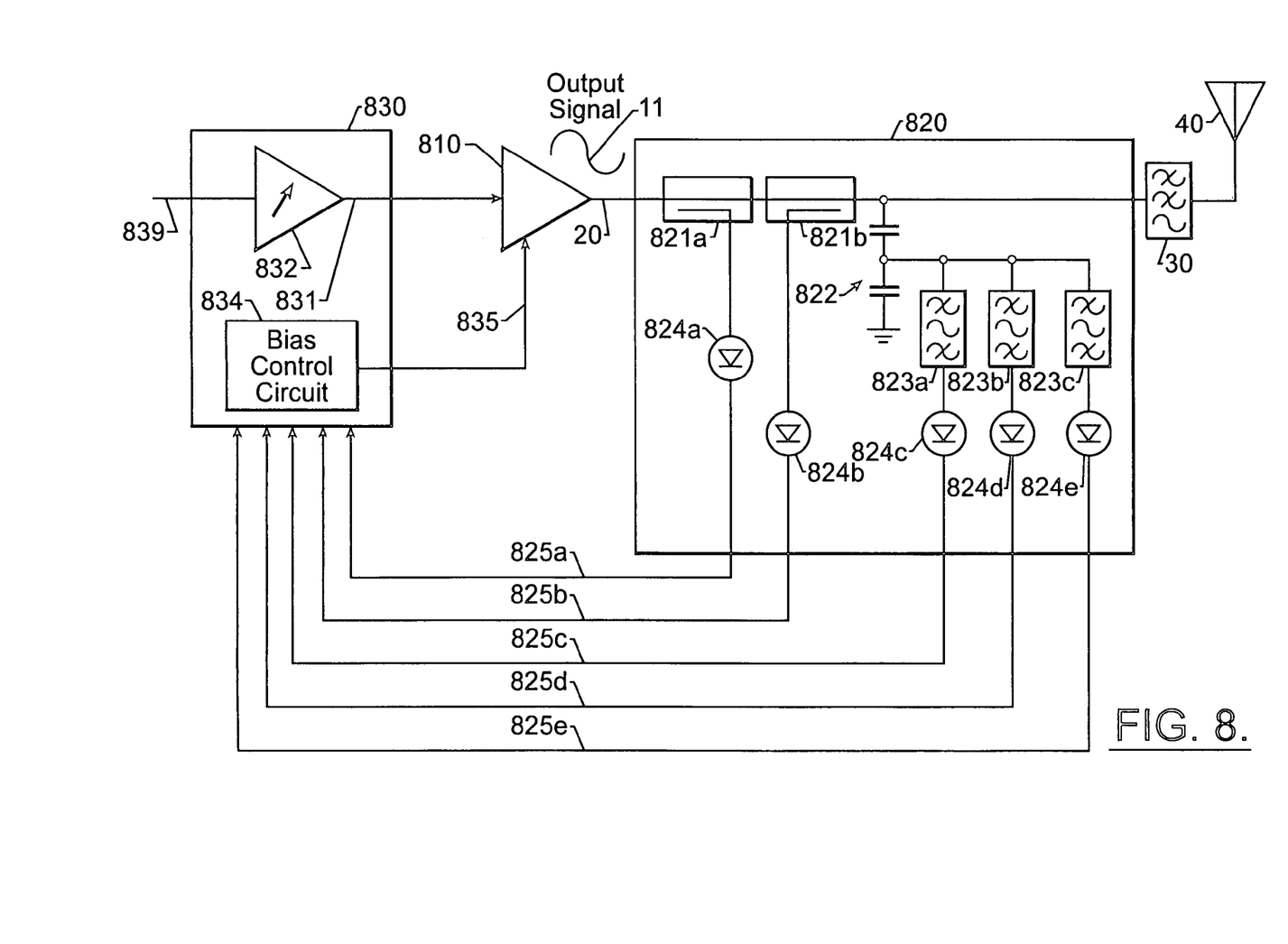

Other embodiments of the invention are illustrated in FIG. 8. A power amplifier 810 receives an input signal 831 from a variable gain amplifier 832 of a control circuit 830. The variable gain amplifier 832 generates the input signal 831 responsive to a carrier-modulated signal 839 generated by, for example, a modulator (not shown), at a gain that is controlled responsive to a level control signal 835. Responsive to the input signal 831, the power amplifier 810 generates an output signal 11 on a transmission line 20 coupled to a low pass filter 30 and antenna 40. The power amplifier 810 operates with a DC bias controlled by a bias control signal 833 applied by the bias control circuit 834 included in the control circuit 830.

A detector circuit 820 is coupled to the transmission line 20, and includes a first and second directional couplers 821a, 821b coupled to respective first and second power detectors 824a, 824b. The first and second power detectors 824a, 824b generate respective first and second detector signals 825a, 825b representing respective forward and reflected fundamental power levels of the power amplifier output signal 11. The detector circuit 820 further includes first, second and third bandpass filters 823a, 823b, 823c coupled to the transmission line 20 by a shunt circuit 822. Responsive to the outputs of the bandpass filters 823a, 823b, 823c, third, fourth, and fifth power detectors 824c, 824d, 824e generate third, fourth and fifth detector signals 825c, 825d, 825e that represent respective power levels of respective harmonic components of the power amplifier output signal 11. The control circuit 830 receives the detector signals 825a, 825b, 825c, 825d, 825e, and controls the variable gain amplifier 832 and the bias control circuit 834 responsive to a comparison of the detector signals 825a, 825b, 825c, 825d, 825e.

It will be appreciated that the embodiments described with reference to FIGS. 7 and 8 are provided for illustrative purposes, and that a variety of other circuit configurations fall within the scope of the invention. For example, instead of determining power for discrete, multiple harmonics as illustrated in FIGS. 7 and 8, power of a single harmonic or an aggregate of harmonics may be determined. In addition, instead of shunt-type harmonic detection, dual-band directional couplers (as described, for example, with reference to FIGS. 3 and 4) or other devices may be used to detect harmonics. Techniques for controlling power amplifier linearity other than input signal level and bias may also be used.

Figure 9:
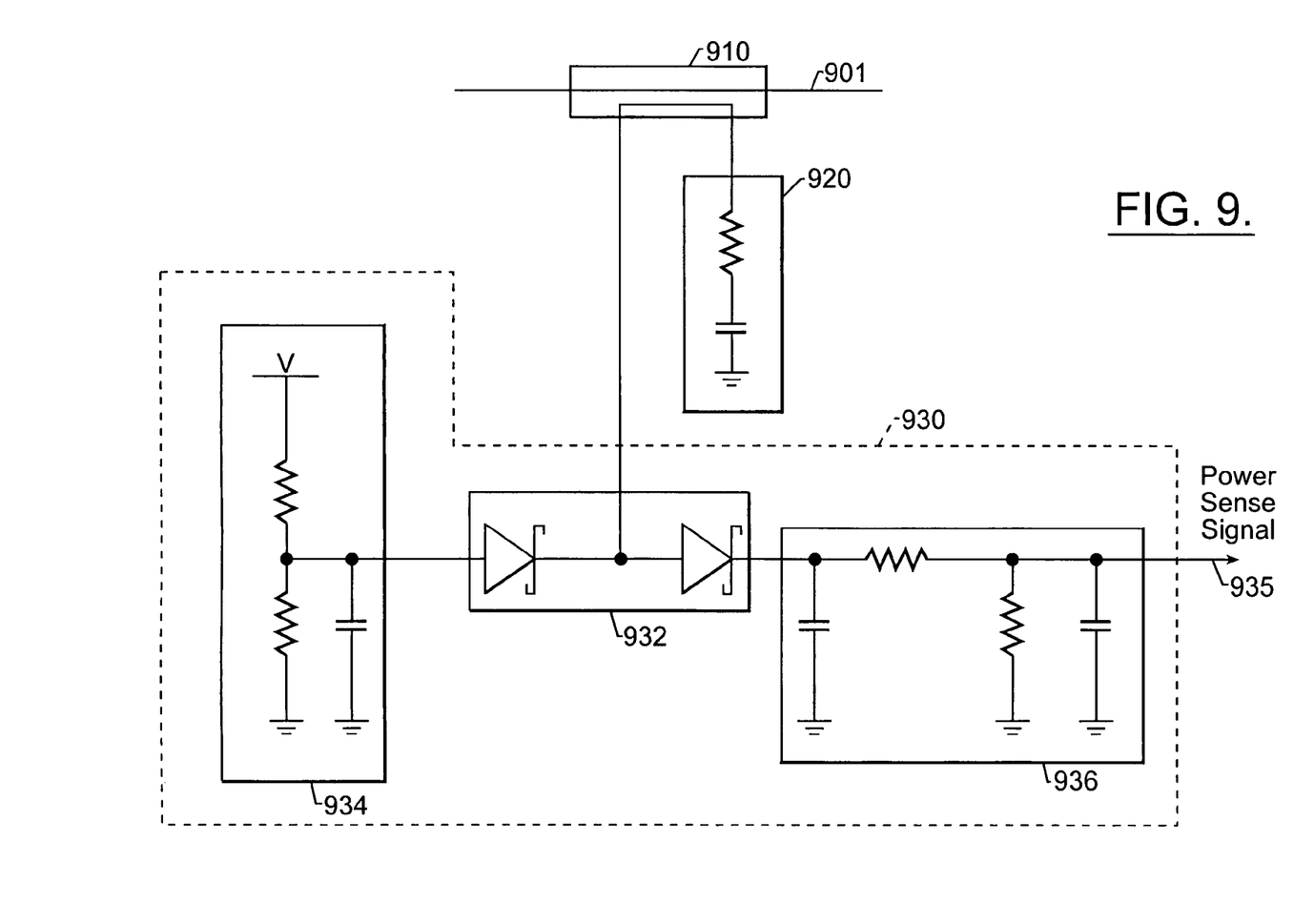
FIG. 9 is a schematic diagram illustrating a power detection circuit according to embodiments of the invention.

FIG. 9 illustrates a power detection circuit 930, in particular, an envelope-type power detection circuit, that may be used with the present invention. As shown, the power detection circuit 930 is coupled, along with a termination circuit 920, to a directional coupler 910. The directional coupler 910 is also coupled to a transmission line 901, e.g., a transmission line connecting a power amplifier to an antenna, and generates a signal that is applied to the power detection circuit 930 responsive to a signal present on the transmission line 901. The power detection circuit 930 includes a diode pair 932 that produces a power second signal 935 that is biased and filtered by first and second circuits 934, 936. In particular, the second circuit 936 may be configured such that the power sense signal 935 represents a selected component, e.g., fundamental or harmonic, of a signal present on the transmission line 901.

Figure 10:
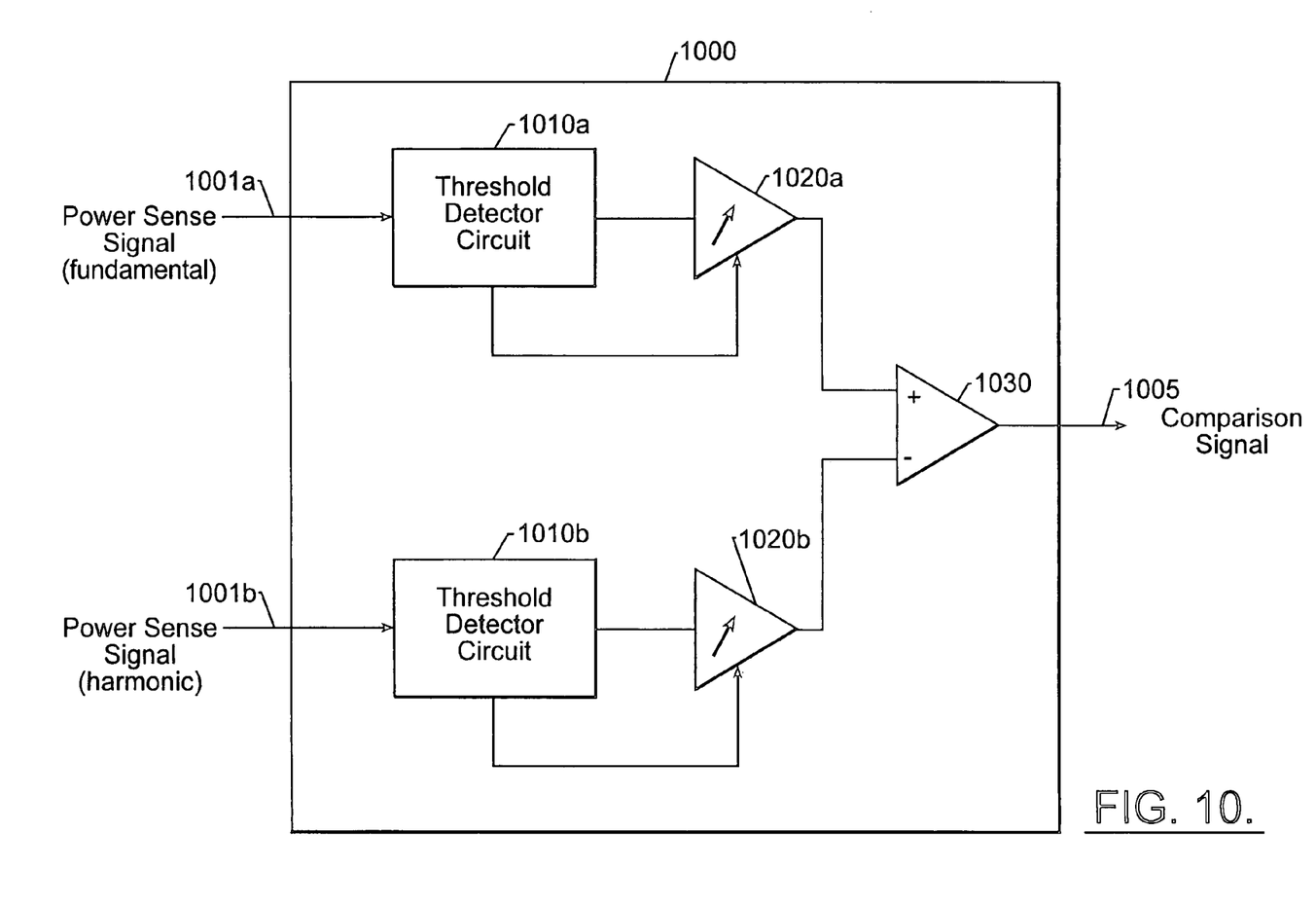
FIG. 10 is a schematic diagram illustrating a power comparison circuit according to embodiments of the invention.

FIG. 10 illustrates an exemplary comparison circuit 1000 that compares respective power sense signals 1001a, 1001b for respective fundamental and harmonic components of a signal. The power sense signals 1001a, 1001b are threshold detected by respective threshold detector circuits 1010a, 1010b and amplified by respective variable gain amplifiers 1020a, 1020b. In conjunction with the threshold detector circuits 1010a, 1010b, the variable gain amplifiers 1020a, 1020b generate respective signals that have desired levels for comparison of the fundamental and harmonic components that are applied to a comparator circuit 1030, e.g., an operational amplifier circuit configured to generate a signal 1005 indicative of the relative power levels of the fundamental and harmonic components represented by the power sense signals 1001a, 1001b. The signal 1005 may serve, for example, as an indication of linearity of a power amplifier that produces the fundamental and harmonic components, as described above with reference to FIG. 1.

It will be appreciated that the power detection circuit 930 of FIG. 9 and the comparison circuit 1000 of FIG. 10 are provided for exemplary purposes, and that a variety of other types of detector and comparison circuits may be used with the invention. It will be understood that, in general, such circuits may include analog and/or digital circuitry.

In the drawings and specification, there have been disclosed typical illustrative embodiments of the invention and, although specific terms are employed, they are used in a generic and descriptive sense only and not for purposes of limitation, the scope of the invention being set forth in the following claims.

What is claimed is:

1. An apparatus for monitoring a power amplifier coupled to a transmission medium, the apparatus comprising:
   a detector circuit, coupled to the transmission medium, that generates first and second detector signals corresponding to fundamental and harmonic components, respectively, of a power amplifier output signal produced by the power amplifier, wherein the detector circuit comprises:
- a directional coupler that couples the power amplifier to the antenna and that generates an output signal responsive to the power amplifier output signal;
- a first power detector, coupled to the directional coupler, that generates the first detector signal from the output signal generated by the directional coupler;
- a capacitor shunt circuit, coupled to the transmission medium;
- a filter, capacitively coupled to the transmission medium by the capacitor shunt circuit, that filters the power amplifier output signal to produce a filtered output signal;
- a second power detector, coupled to the filter, that generates the second detector signal from the filtered output signal; and
- a comparing circuit, coupled to the detector circuit, that compares the first and second detector signals.

2. An apparatus according to claim 1 wherein the comparing circuit generates a signal that indicates linearity of the power amplifier responsive to a comparison of the first and second detector signals.

3. An apparatus according to claim 1 wherein the second power detector generates the second detector signal without requiring phase information for the harmonic component.

4. An apparatus according to claim 1 wherein the first and second detector signals represent first and second powers for the fundamental and harmonic components, respectively.

5. An apparatus according to claim 1 wherein the second detector signal comprises a plurality of second detector signals, respective ones of which correspond to respective harmonic components of the power amplifier output signal.

6. An apparatus for monitoring a power amplifier coupled to a transmission medium, the apparatus comprising:
- a detector circuit, coupled to the transmission medium, that generates first and second detector signals corresponding to fundamental and harmonic components, respectively, of a power amplifier output signal produced by the power amplifier, the detector circuit comprising:
  - a first directional coupler that couples the power amplifier to the antenna and that generates a first output signal responsive to the power amplifier output signal.
  - a first power detector, coupled to the first directional coupler, that generates the first detector signal from the first output signal;
  - a second directional coupler that couples the power amplifier to the antenna and that generates a second output signal; and
  - a second power detector, coupled to the second directional coupler, that generates the second detector signal from the second output signal,
  - wherein the first output signal corresponds to a forward fundamental component, wherein the second output signal corresponds to a reflected harmonic component, and wherein the second directional coupler generates a third output signal corresponding to a reflected fundamental component;
- a comparing circuit, coupled to the detector circuit, that compares the first and second detector signals; and
- a third power detector, coupled to the second directional coupler, that processes the third output signal to determine power reflected to the power amplifier.

7. An apparatus, comprising:
- an antenna;
- a power amplifier that generates a power amplifier output signal in a transmission medium coupling the power amplifier to the antenna;
- a detector circuit, coupled to the transmission medium, that generates first and second detector signals corresponding to fundamental and harmonic components, respectively, of the power amplifier output signal, wherein the detector circuit comprises:
  - a first directional coupler that couples the power amplifier to the antenna and that generates a first output signal corresponding to a forward fundamental component responsive to the power amplifier output signal;
  - a first power detector, coupled to the first directional coupler, that generates the first detector signal from the first output signal;
  - a second directional coupler that couples the power amplifier to the antenna and that generates a second output signal corresponding to a reflected harmonic component and a third output signal corresponding to a reflected fundamental component;
  - a second power detector, coupled to the second directional coupler, that generates the second detector signal from the second output signal; and
  - a third power detector, coupled to the second directional coupler, that processes the third output signal to determine power reflected to the power amplifier; and
- a control circuit, coupled to the detector circuit and operatively associated with the power amplifier, that controls a DC bias of the power amplifier responsive to a comparison of the first and second detector signals.

8. An apparatus according to claim 7 wherein the control circuit controls linearity of the power amplifier responsive to a comparison of the first and second detector signals.

9. An apparatus according to claim 7 wherein the control circuit comprises:
- a baseband processor that generates a data signal; and
- a modulator, coupled to the baseband processor, that receives the data signal and modulates the received data signal to generate an input signal such that the level of the input signal varies responsive to a level control signal applied to the modulator,
wherein the power amplifier receives the input signal and generates the power amplifier output signal therefrom, and wherein the baseband processor is responsive to the detector circuit to generate the level control signal applied to the modulator responsive to a comparison of the first and second detector signals.

10. An apparatus according to claim 9 wherein the baseband processor is further operative to apply a bias control signal to the power amplifier responsive to a comparison of the first and second detector signals.

11. An apparatus according to claim 7 wherein the control circuit comprises a bias control circuit, responsive to the detector circuit, that applies a bias control signal to the power amplifier responsive to a comparison of the first and second detector signals.

12. An apparatus according to claim 7 wherein the second power detector is operative to generate the second detector signal without requiring phase information for the harmonic component.

13. An apparatus according to claim 7 wherein the first detector signal represents a forward power for the fundamental component.

14. An apparatus according to claim 13 wherein the second detector signal represents a reflected power for the harmonic component.

15. An apparatus according to claim 7 wherein the first and second detector signals represent respective powers for the fundamental and harmonic components.

16. An apparatus according to claim 7 wherein the detector circuit comprises:

a filter, coupled to the transmission medium, that filters the power amplifier output signal to produce a filtered output signal, wherein the second power detector is coupled to the filter and generates the second detector signal from the filtered output signal.

17. An apparatus according to claim 16 wherein the filter is capacitively coupled to the transmission medium.

18. An apparatus according to claim 7 wherein the second detector signal comprises a plurality of second detector signals, respective ones of which correspond to respective harmonic components of the power amplifier output signal.

* * * * *